United States Patent
Kawazoe

[11] Patent Number: 5,945,740
[45] Date of Patent: Aug. 31, 1999

[54] SEMICONDUCTOR DEVICE

[75] Inventor: Takayuki Kawazoe, Tokyo, Japan

[73] Assignee: NEC Corporation, Tokyo, Japan

[21] Appl. No.: 08/901,765

[22] Filed: Jul. 28, 1997

[30] Foreign Application Priority Data

Jul. 26, 1996 [JP] Japan ..................... 8-197528

[51] Int. Cl.$^6$ .................. H01L 23/48; H01L 23/52; H01L 29/40
[52] U.S. Cl. .................. 257/776; 257/750; 257/749
[58] Field of Search ............ 257/776, 750, 257/752, 749, 748, 758

[56] References Cited

FOREIGN PATENT DOCUMENTS

| 62-135837 | 6/1987 | Japan . | |
| 62-234347 | 10/1987 | Japan | H01L 21/88 |
| 62-279660 | 12/1987 | Japan | H01L 21/88 |
| 574701 | 3/1993 | Japan . | |

Primary Examiner—Mahshid Saadat
Assistant Examiner—Jhihan B Clark
Attorney, Agent, or Firm—Hayes Soloway Hennessey, Grossman & Hage, PC

[57] ABSTRACT

A semiconductor device comprising a lower level pattern formed on a semiconductor substrate, an interlayer insulator film covering the lower level pattern, and an upper level pattern formed on the interlayer insulator film, a step being formed on a surface of the interlayer insulator film because of the lower level pattern. The upper level pattern having a dummy pattern formed integrally therewith to extend near to the step in a plan view or to extend so as to partially overlap with the step in the plan view. Alternatively, the lower level pattern has a dummy pattern formed integrally therewith to extend near to an edge of the upper level pattern in a plan view, or to extend so as to overlap partially with the edge of the upper level pattern in the plan view.

7 Claims, 7 Drawing Sheets

SEMICONDUCTOR DEVICE

BACKGROUND OF THE INVENTION

1. Field of the Invention

The present invention relates to a semiconductor device, and more specifically to a semiconductor device formed by a process including a photolithography step of forming a resist pattern on a substrate having a step.

2. Description of Related Art

Conventionally, in order to form a desired resist pattern on a semiconductor substrate (wafer), a photoresist is deposited on a principal surface of the semiconductor substrate, and an exposure mask is positioned and aligned with the principal surface of the semiconductor substrate, and then, an energy ray such as light or an X-ray is irradiated through the exposure mask to the photoresist film deposited on the principal surface of the semiconductor, for exposure of the photoresist film, and thereafter, the exposed photoresist film is developed. Thus, the desired resist pattern is obtained on the semiconductor substrate Referring to FIG. 1A, there is shown a diagrammatic plan view of two different level wiring conductors in a semiconductor device manufactured in accordance with one prior art process. FIGS. 1B, 1C and 1D are diagrammatic sectional views, taken along the line I—I in FIG. 1A, of a semiconductor device manufactured in accordance with the first prior art process and an exposure mask used in the first prior art process, for illustrating various recesses formed in the resist pattern because of halation which will be described later.

As shown in FIGS. 1A, 1B, 1C and 1D, a lower level wiring conductor pattern 12 is formed through an insulator film on a principal surface of a semiconductor substrate 11, and an interlayer insulator film 13 and an upper level wiring conductor film 14 are formed in the named order on the lower level wiring conductor pattern 12 and the semiconductor substrate 11. A positive photoresist film 15 is deposited on the upper level wiring conductor film 14, and is exposed by utilizing an exposure mask 16 having a light blocking pattern 17. Thereafter, the photoresist film 15 is developed to obtain a resist pattern 15A.

However, the prior art process has such a disadvantage that, if on the substrate 11 there exists a step "S" attributable to the lower level wiring conductor pattern 12, the resist pattern 15A precisely corresponding to the light blocking pattern 17 of the exposure mask 16 cannot be obtained. The reason for this disadvantage is considered that, irradiation light 18 is reflected by the surface of the upper level wiring conductor film 14 in the step "S" into an oblique direction (halation), so that a portion of the photoresist film 15 to be shielded by the light blocking pattern 17 is exposed to an undesired reflection light causing the halation.

In particular, as shown in FIGS. 1A, 1B, 1C and 1D, in a bent or angled portion 12A of the lower level wiring conductor pattern 12, the step forms a three-dimensionally curved concave surface, so that by action of a concave mirror effect, a light 10 reflected by the step in the angled portion 12A is collected to one point or small area 19 of the photoresist which should be shielded from the exposure light, with the result that the photoresist of the point or small area 19 is intensely exposed. Thus, in some cases, a recess 19B as shown in FIG. 1B is formed at a middle portion in a height of the resist pattern 15A, and in other cases, a notch or groove 19C as shown in FIG. 1C is formed which extends from a middle portion in a height of the resist pattern 15A to a top of the resist pattern 15A. In extreme cases, a hole 19D as shown in FIG. 1D is formed which penetrates through a middle portion of the resist pattern 15A.

When the upper level wiring conductor film 14 is etched and patterned by using the resist pattern thus formed, to form an upper level wiring conductor pattern 14A, a narrow portion 19A is formed in the upper level wiring conductor pattern 14A, as shown in FIG. 1A. The upper level wiring conductor pattern 14A is easily destroyed or disconnected at the narrow portion 19A, and therefore, the semiconductor device having a satisfactory reliability cannot be obtained.

In order to eliminate the above mentioned disadvantage caused by the halation, Japanese Patent Application Pre-examination Publication No. JP-A-05-074701, (an English abstract of which is available from the Japanese Patent Office, and the content of the English abstract of JP-A-05-074701 is incorporated by reference in its entirety into this application) proposes to use an exposure mask 16A having a dummy mask pattern 17A at a position corresponding to the step "S" on the surface of the substrate 11, in addition to the light block pattern 17 required inherently, as shown in FIG. 2. The provision of the dummy mask pattern 17A prevents the step "S" from being irradiated with the exposure light 18, so that the halation is prevented, and therefore, a highly precise resist pattern can be obtained.

In this second prior art process, however, not only the resist pattern 15A corresponding to the inherent light blocking pattern 17 but also the resist pattern 15B corresponding to the dummy mask pattern 17A are formed from the photoresist 15. Therefore, when the upper level wiring conductor film 14 is etched by using the resist patterns thus patterned, there is formed an isolated or floating pattern of the upper level wiring conductor film 14 which does not contribute a circuit operation. Rather, this isolated or floating pattern of the upper level wiring conductor film 14 generates a parasite capacitance to adjacent wiring layers, with the result that a signal transmission speed drops. On the other hand, if the floating pattern of the upper level wiring conductor film 14 is fine or small, the floating pattern is collapsed or peeled off, so that the collapsed or peeled-off floating pattern remains as a foreign matter on the substrate, which causes a short-circuiting between wiring conductors, and therefore, which lowers reliability of the semiconductor device.

Furthermore, Japanese Patent Application Pre-examination Publication No. JP-A-62-135837, (an English abstract of which is available from the Japanese Patent Office, and the content of the English abstract of JP-A-62-135837 is incorporated by reference in its entirety into this application) proposes to use an exposure mask 16D having a dummy pattern 17B having a size smaller than a limit of resolution above the step "S" on the surface of the substrate 11, as shown in FIG. 3. This dummy pattern 17B prevents the step "S" from being directly irradiated with the exposure light 18, and also, presents formation of the above mentioned floating pattern because a diffraction light generated by the dummy pattern 17B is irradiated onto the step "S" and therefore because a resist pattern is not formed on the step "S".

However, although the third prior art method as mentioned above can prevent the formation of the floating pattern, the diffraction light is irradiated onto the step "S". This diffraction light is weaker than the direct irradiation light, but the light reflected by the bent portion of the lower level wiring conductor pattern 12 is collected, with the result that influence of halation is still non-negligible, and it is still difficult to form a highly precise resist pattern. Furthermore, since the dummy pattern 17B is small in size, it is impossible to complete shield the step "S", and it is difficult to prevent the halation caused by the direct irradiation light.

SUMMARY OF THE INVENTION

Accordingly, it is an object of the present invention to provide a semiconductor device, which has overcome the above mentioned defect of the conventional one.

Another object of the present invention is to provide a semiconductor device having no floating pattern of conductive material and having a highly precise wiring conductor pattern, thereby to have an elevated reliability.

The above and other objects of the present invention are achieved in accordance with the present invention by a semiconductor device comprising a lower level pattern formed on a semiconductor substrate and forming a step on the semiconductor substrate, and an upper level pattern formed of a layer which is formed at a level higher than a level of a layer forming the lower level pattern, the upper level pattern having a dummy pattern formed integrally therewith to extend near to the step in a plan view or to extend so as to partially overlap with the step in the plan view. Alternatively, the lower level pattern has a dummy pattern formed integrally therewith to extend near to an edge of the upper level pattern in a plan view, or to extend so as to overlap partially with the edge of the upper level pattern in the plan view.

For the purpose of manufacturing the semiconductor device as mentioned above in accordance with the present invention, there can be adopted a method for manufacturing a semiconductor device, including the steps of forming an upper level pattern material layer to cover a lower level pattern formed on a semiconductor substrate, depositing a photosensitive resist film to cover the upper level pattern material layer, selectively exposing the photosensitive resist film to form a patterned resist film, and patterning the upper level pattern material layer by using the patterned resist film as a mask to form an upper level pattern, the selective exposure of the photosensitive resist film being performed by using an exposure mask having a dummy pattern which is integral with an inherent mask pattern used for forming the upper level pattern and which covers a step formed because of the lower level pattern.

For the purpose of manufacturing the semiconductor device as mentioned above in accordance with the present invention, there can be adopted another method for manufacturing a semiconductor device, including the steps of forming an upper level pattern material layer to cover a lower level pattern formed on a semiconductor substrate, depositing a photosensitive resist film to cover the upper level pattern material layer, selectively exposing the photosensitive resist film to form a patterned resist film, and patterning the upper level pattern material layer by using the patterned resist film as a mask to form an upper level pattern, the lower level pattern being previously formed to have a dummy pattern which extends to an edge of an inherent mask pattern corresponding to the upper level pattern, of an exposure mask used for the selective exposure of the photosensitive resist film, so that a step formed because of the dummy pattern of the lower level pattern is positioned directly under the inherent mask pattern of the exposure mask corresponding to the upper level pattern.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
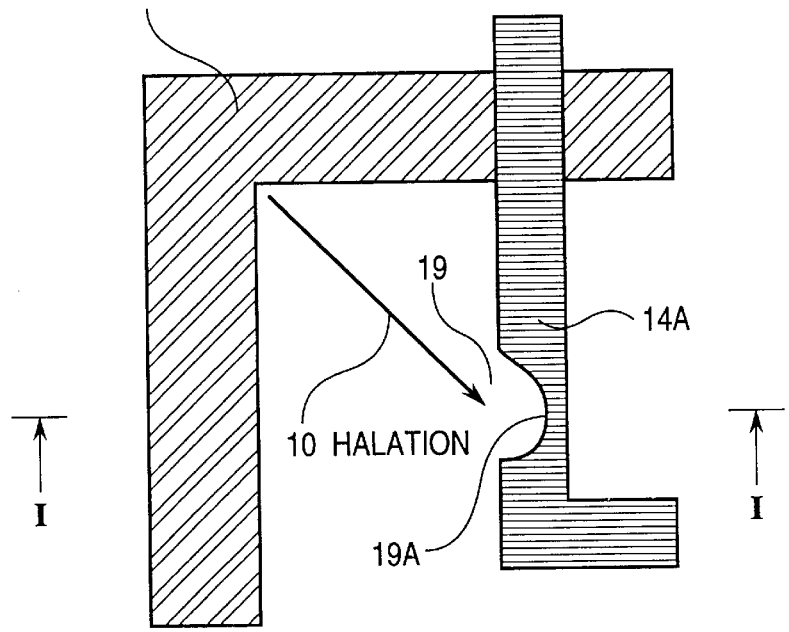
FIG. 1A is a diagrammatic plan view of two different level wiring conductors in a semiconductor device manufactured in accordance with the first prior art process.
Figure 1B:
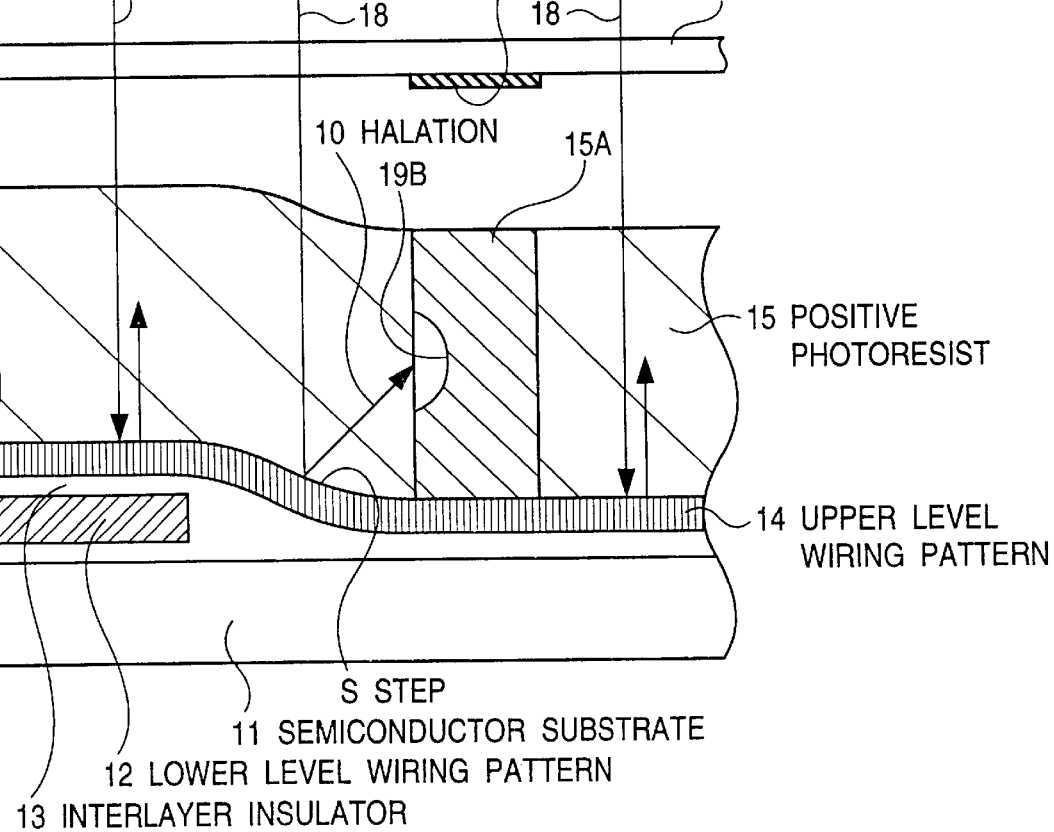
FIGS. 1B, 1C and 1D are diagrammatic sectional views, taken along the line I—I in FIG. 1A, of a semiconductor device manufactured in accordance with the first prior art process and an exposure mask used in the first prior art process, for illustrating various recesses formed in the resist pattern because of halation.
Figure 1C:
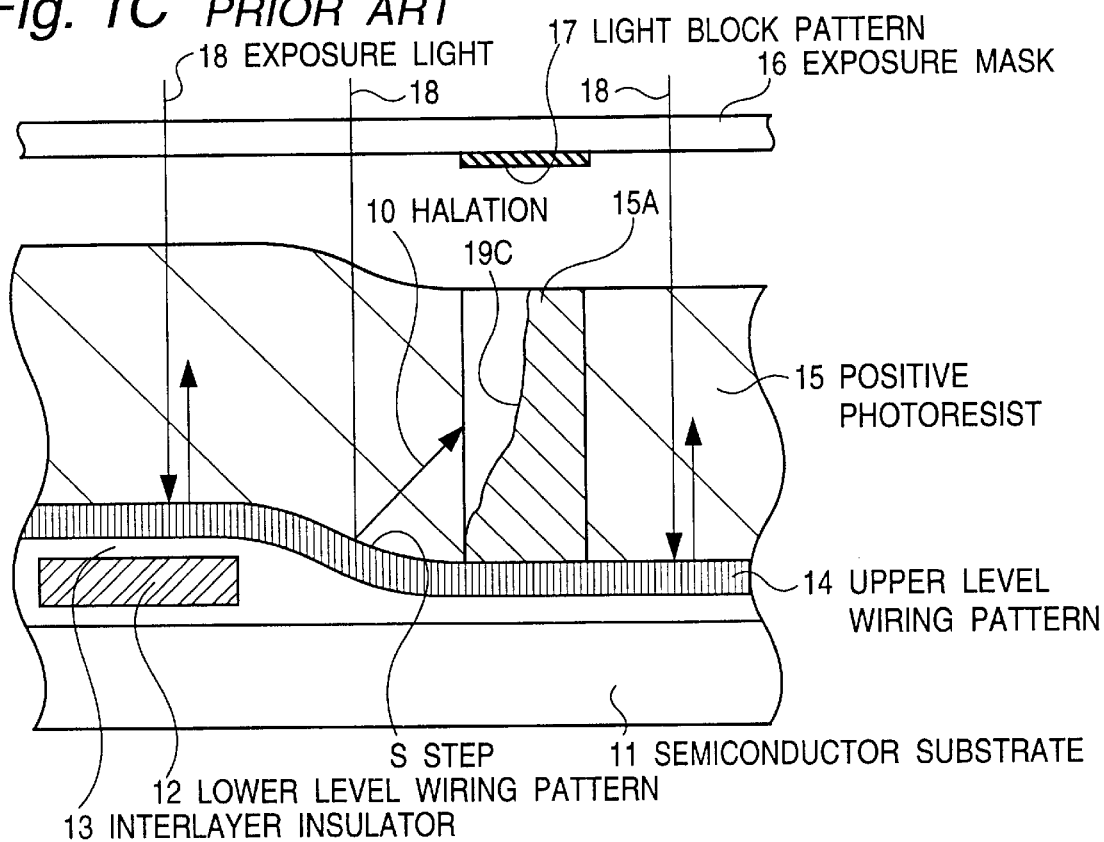
Figure 1D:
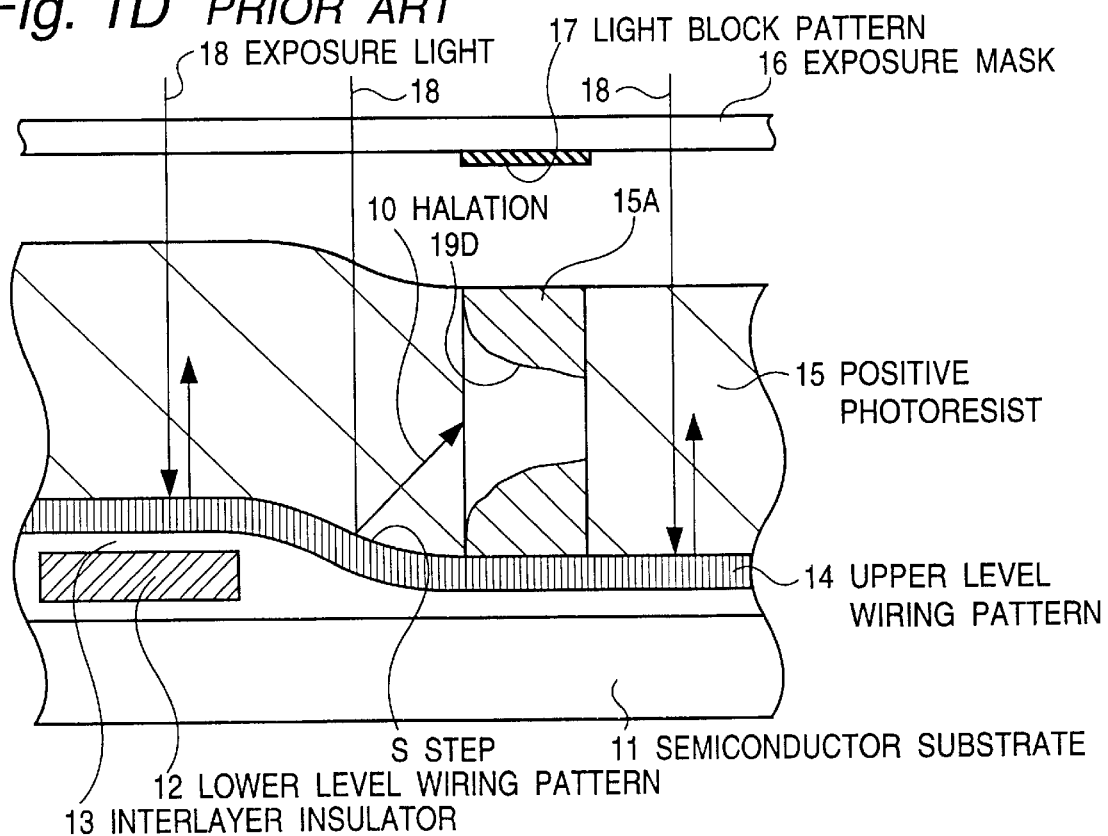
Figure 2:
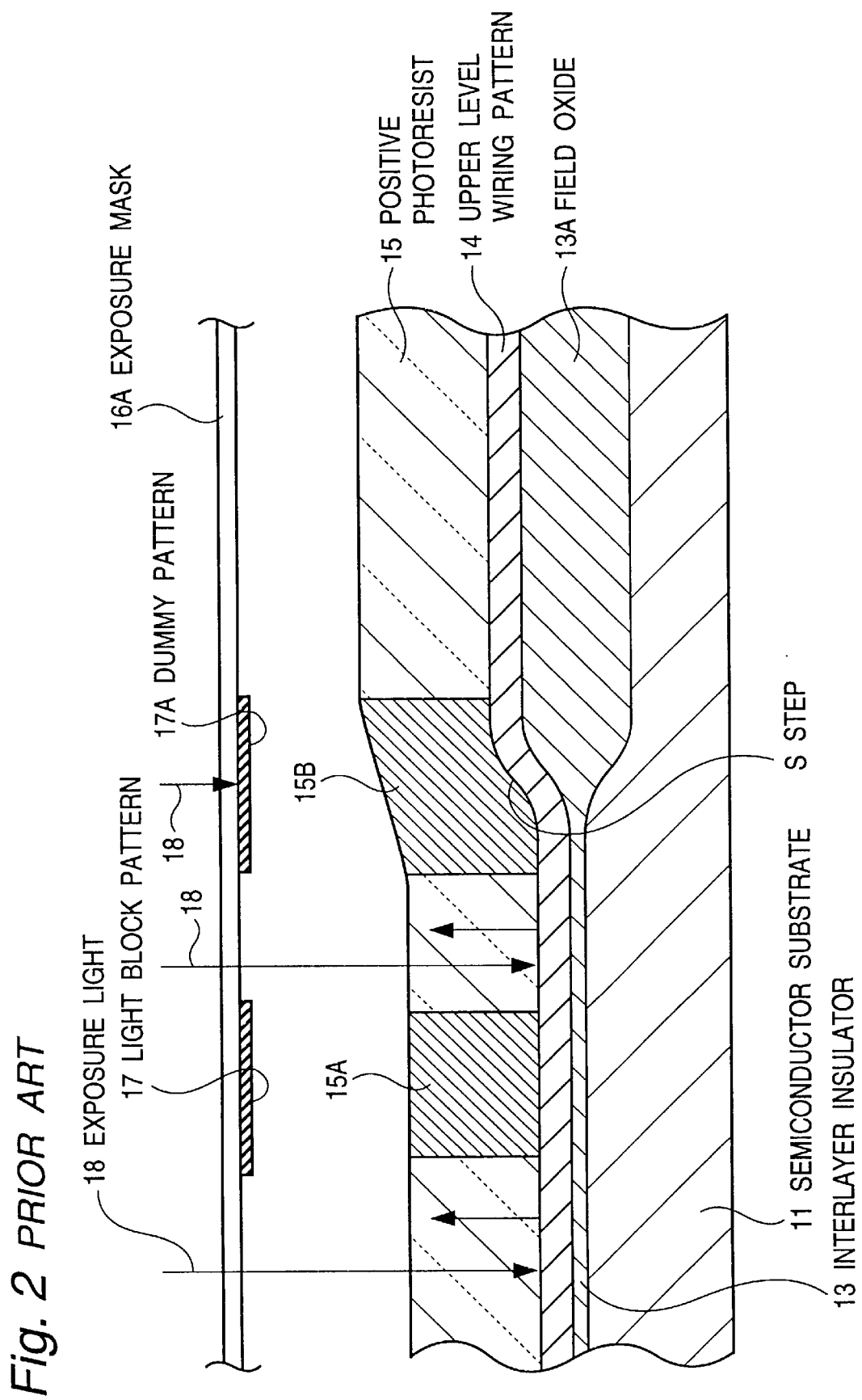
FIG. 2 is a diagrammatic sectional view of a semiconductor device manufactured in accordance with the second prior art process and an exposure mask used in the second prior art process.
Figure 3:
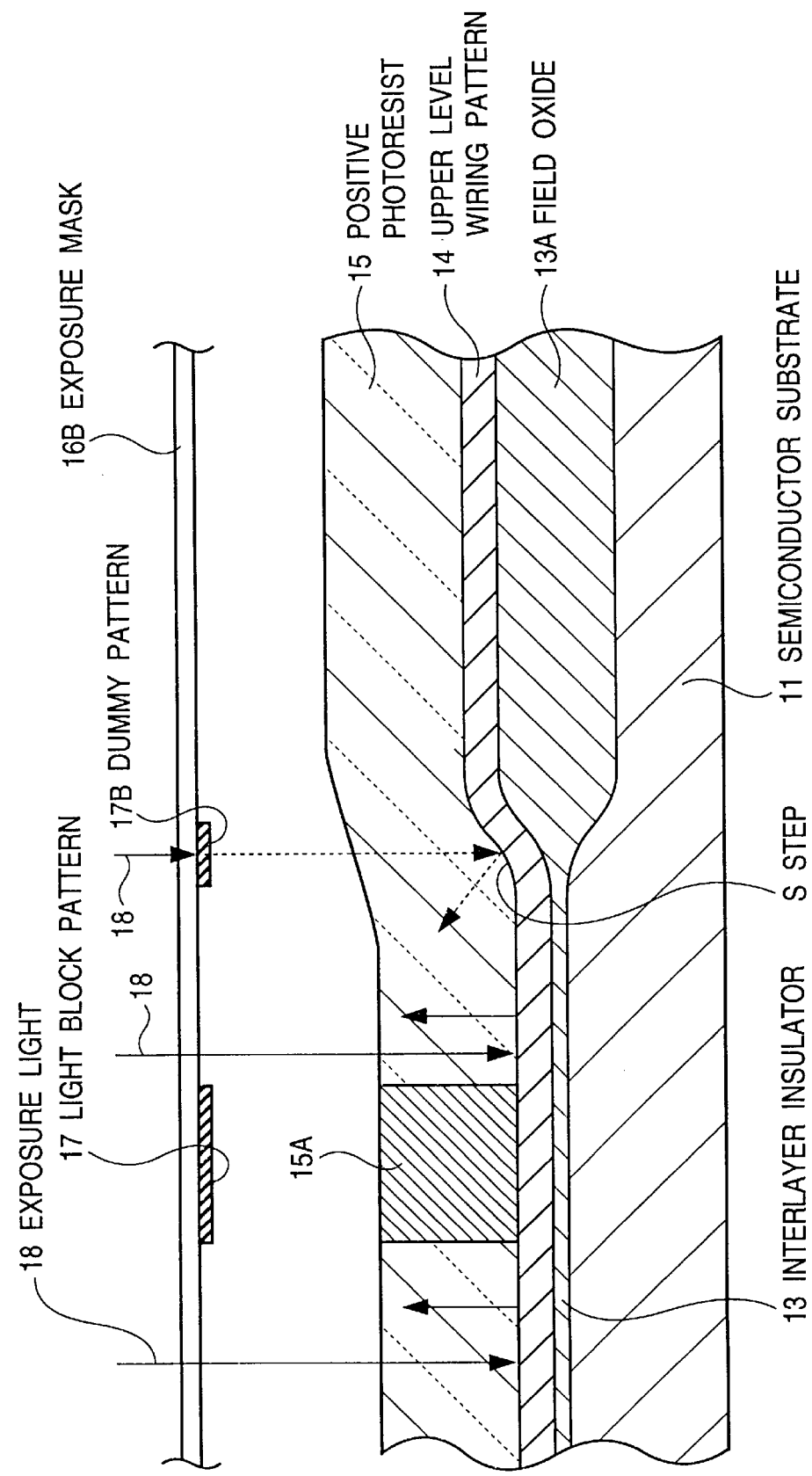
FIG. 3 is a diagrammatic sectional view of a semiconductor device manufactured in accordance with the third prior art process and an exposure mask used in the third prior art process.
Figure 4A:
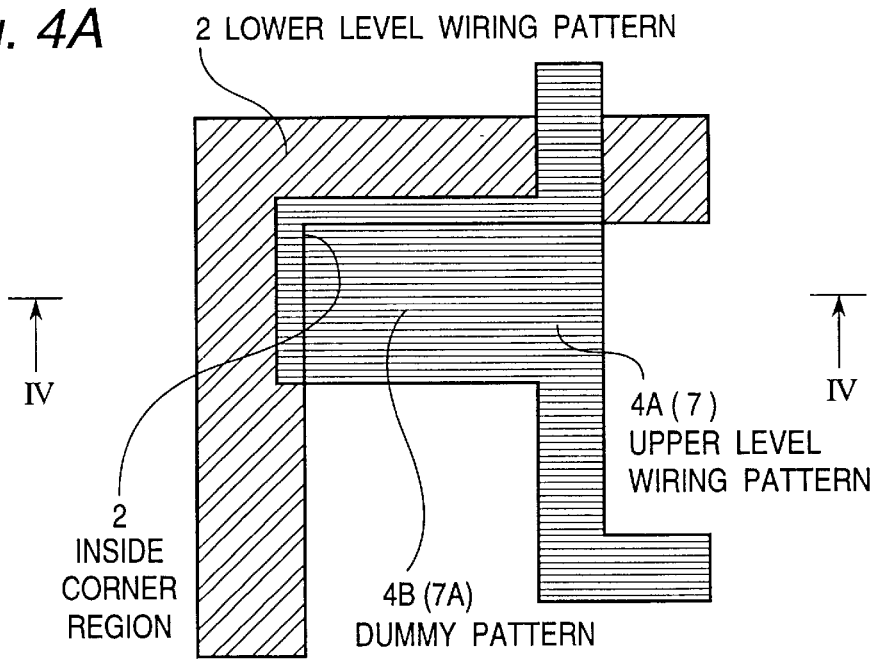
FIG. 4A is a diagrammatic plan view of two different level wiring conductors in a first embodiment of the semiconductor device in accordance with the present invention.
Figure 4B:
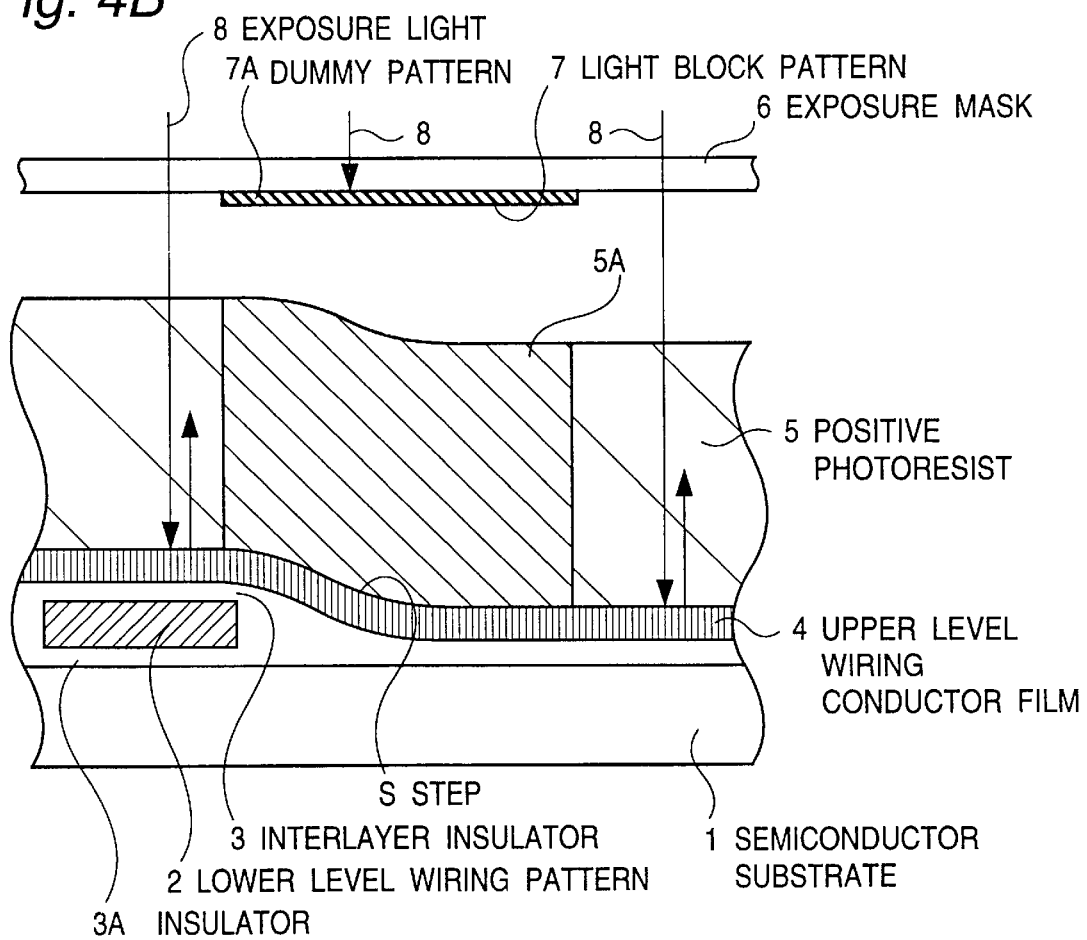
FIG. 4B is a diagrammatic sectional view, taken along the line IV—IV in FIG. 4A, of a semiconductor device manufactured in accordance with a first embodiment of the process for manufacturing the semiconductor device in accordance with the present invention and an exposure mask used in the first embodiment process.

Referring to FIGS. 4A and 4B, there are shown a diagrammatic plan view of two different level wiring conductors in a first embodiment of the semiconductor device in accordance with the present invention, and a diagrammatic sectional view, taken along the line IV—IV in FIG. 4A, of a semiconductor device manufactured in accordance with a first embodiment of the process for manufacturing the semiconductor device in accordance with the present invention and an exposure mask used in the first embodiment process.

As shown in FIGS. 4A and 4B, the first embodiment of the semiconductor device in accordance with the present invention includes a semiconductor substrate 1 and a lower level wiring conductor pattern 2 selectively formed through an insulator film 3A on a principal surface of the semiconductor substrate 1. On the lower level wiring conductor pattern 2 and the principal surface of the semiconductor substrate 1, an interlayer insulator film 3 is formed, and then, an upper level wiring conductor film 4 is formed on the interlayer insulator film 3. Because of the lower level wiring conductor pattern 2, a step "S" having a height difference of 3000 A to 4000 A is generated in the surface of the substrate (namely, the surface of the upper level wiring conductor film 4) The upper level wiring conductor film 4 is formed of for example a polysilicon, tungsten or aluminum. A positive photoresist film 5 is deposited on the upper level wiring conductor film 4, and is selectively exposed through an exposure mask 6 by an exposure irradiation 8 from an exposure machine.

Here, the exposure mask 6 includes a light blocking pattern 7 which constitutes an inherent mask pattern corresponding to an upper level wiring conductor pattern to be formed from the upper level wiring conductor film 4, and a dummy pattern 7A formed by extending a portion of the light blocking pattern 7 to cover or shield a region directly above the step "S".

In the shown embodiment, the lower level wiring conductor pattern 2 is formed of a planar pattern in the form of a L-character having a corner angled at a right angle. Therefore, the dummy pattern 7A of the exposure mask 6 is formed to cover at least cover an inside corner region 2A of the L-shaped lower level wiring conductor pattern 2, namely, a step portion positioned at the side of the inherent mask pattern corresponding to the upper level wiring conductor pattern. Furthermore, it is preferred that the dummy pattern 7A partially overlaps the lower level wiring conductor pattern 2 in a plan view with the width of 0.5 $\mu$m to 0.1 $\mu$m.

Accordingly, by using the exposure mask 6 of the above mentioned construction, when the exposure light 8 is irradiated as shown in FIG. 4B, the dummy pattern 7A prevents the step "S" from being directly irradiated by the exposure light 8. Therefore, generation of halation by the step "S", particularly, collection of light reflected by a concave surface of the step "S", is prevented, so that adverse influence of the halation to the inherent photoresist pattern is prevented, and therefore, a highly precise resist pattern 5A can be formed.

In addition, in a semiconductor device manufactured by using the exposure mask of the above mentioned construction, a resist pattern formed by the dummy pattern 7A of the exposure mask 6 is formed integrally with the resist pattern formed by the inherent light blocking pattern 7 of the exposure mask 6. Therefore, when the upper level wiring conductor film 4 is etched by using the resist pattern thus formed to form an upper level wiring conductor pattern 4A, a portion 4B corresponding to the dummy pattern 7A, of the upper level wiring conductor pattern 4A, is formed to cover the step "S". Furthermore, since the portion 4B corresponding to the dummy pattern 7A is formed integrally with the inherent upper level wiring conductor pattern 4A, the portion 4B corresponding to the dummy pattern 7A never becomes a pattern, and therefore, the problem of the prior art attributable to the floating pattern is not generated.

Figure 5:
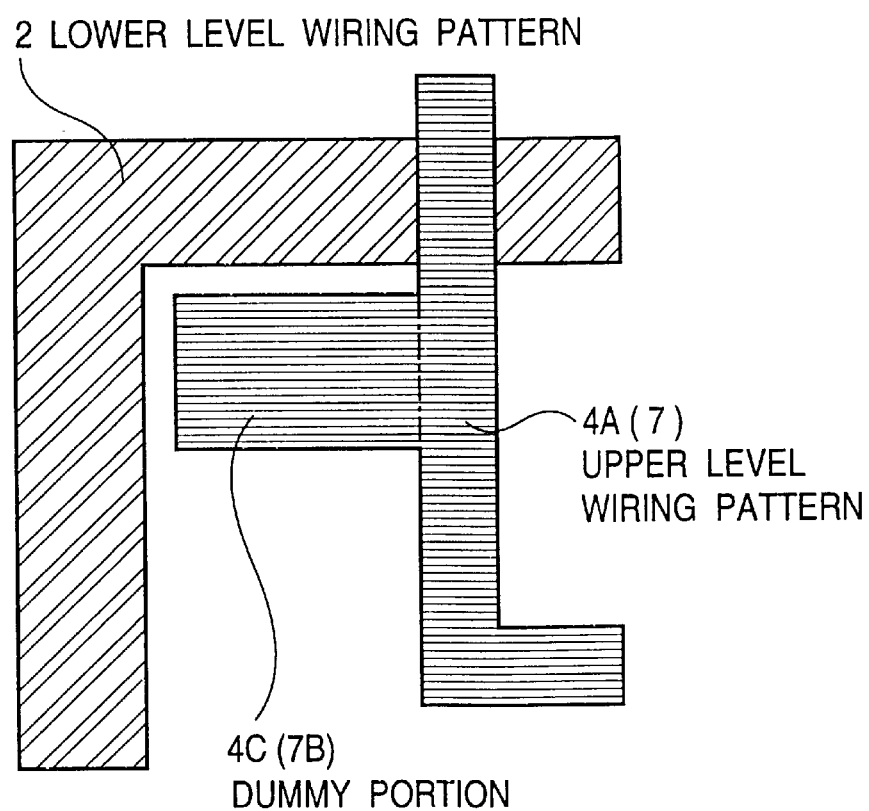
FIG. 5 is a view similar to FIG. 4A, but illustrating a modification of the first embodiment of the semiconductor device in accordance with the present invention.

The dummy pattern 7A is not necessarily required to overlap with the lower level wiring conductor pattern 2. It is sufficient if a dummy pattern 7B of the exposure mask 6 extends near to the lower level wiring conductor pattern 2 in the plan view, as shown in FIG. 5. Even with this modification, the amount of exposure light reaching the step "S" is substantially reduced, thereby to avoid the problem caused by the halation. In addition, since a portion 4C of the upper level wiring conductor pattern 4A corresponding to the dummy pattern 7B does not overlap with the lower level wiring conductor pattern 2, a capacitance between the lower level wiring conductor pattern 2 and the upper level wiring conductor pattern 4A can be reduced in comparison with the first embodiment shown in FIG. 4A.

Figure 6A:
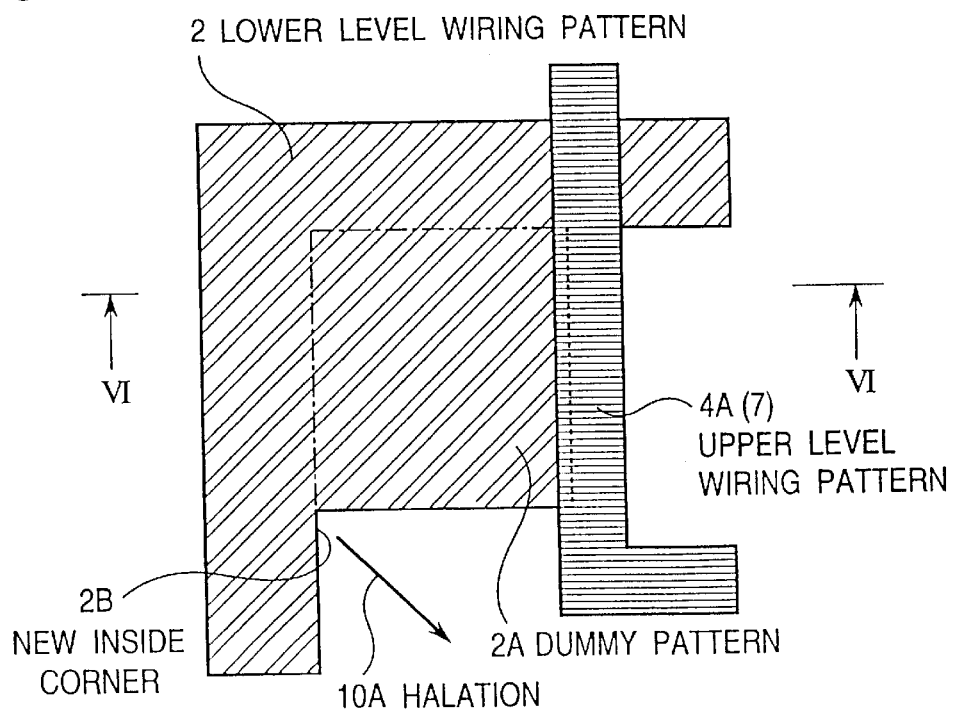
FIG. 6A is a diagrammatic plan view of two different level wiring conductors in a second embodiment of the semiconductor device in accordance with the present invention.
Figure 6B:
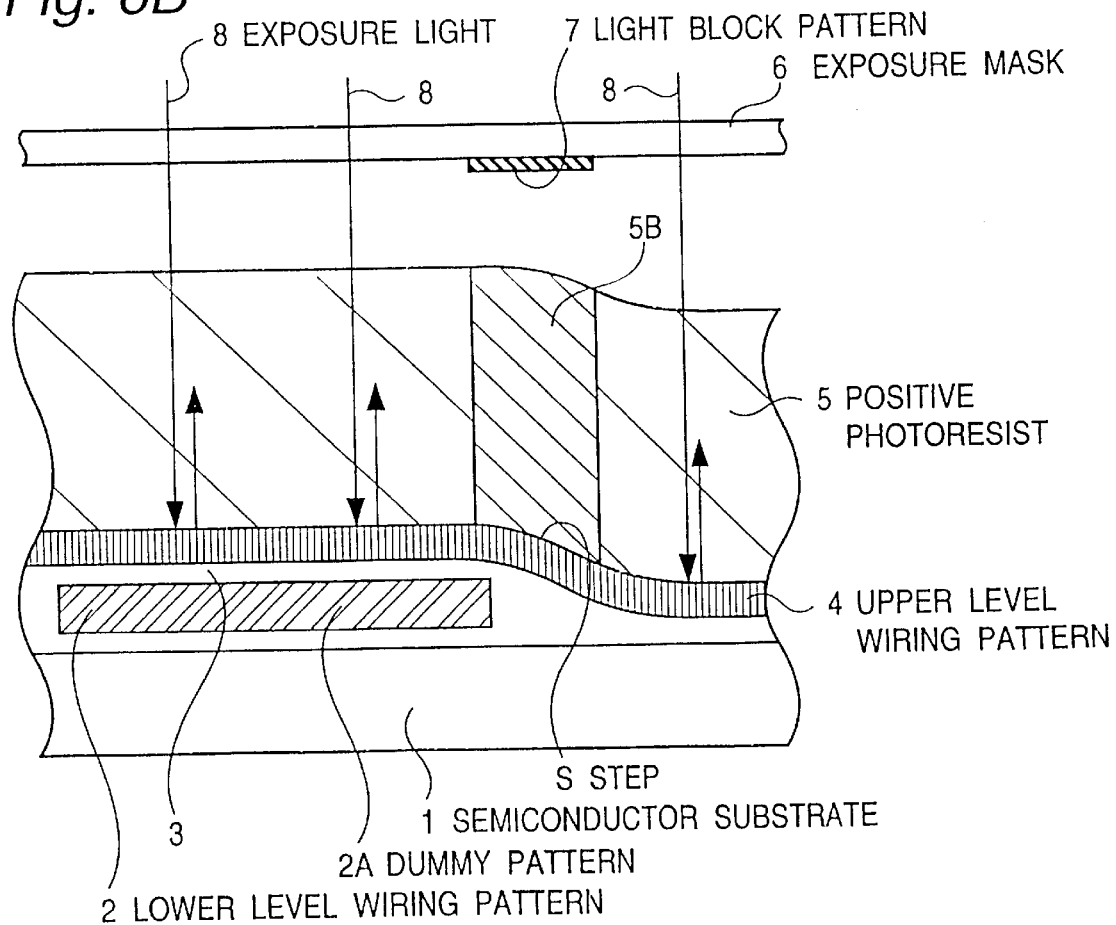
FIG. 6B is a diagrammatic sectional view, taken along the line VI—VI in FIG. 6A, of a semiconductor device manufactured in accordance with a second embodiment of the process for manufacturing the semiconductor device in accordance with the present invention and an exposure mask used in the second embodiment process.

Referring to FIGS. 6A and 6B, there are shown a diagrammatic plan view of two different level wiring conductors in a second embodiment of the semiconductor device in accordance with the present invention, and a diagrammatic sectional view, taken along the line IV—IV in FIG. 6A, of a semiconductor device manufactured in accordance with a second embodiment of the process for manufacturing the semiconductor device in accordance with the present invention and an exposure mask used in the second embodiment process. In FIGS. 6A and 6B, elements similar to those shown in FIGS. 4A and 4B are given the same Reference Numerals, and explanation thereof will be omitted for simplification of description.

In the second embodiment, a dummy pattern 2A is formed in the lower level wiring conductor pattern 2, to extend near to or to partially overlap with an edge of an upper level wiring conductor pattern 4A (which will be formed in a succeeding process) in a plan view, as seen from FIG. 6A. In other words, a portion of the lower level wiring conductor pattern 2 is extended to constitute the dummy pattern 2A, so that as shown in FIG. 6B, the step "S" generated by the edge of the lower level wiring conductor pattern 2 is shifted or moved to a position directly under the inherent light blocking pattern 7 of the exposure mask 6 for forming the upper level wiring conductor pattern 4A. In the shown embodiment, the dummy pattern 2A is formed to cover the inside portion 2A of the right angle corner of the L-shaped lower level wiring conductor pattern 2 shown in FIG. 4A.

In this second embodiment, accordingly, when the positive photoresist film 5 is deposited on the upper level wiring conductor film 4 and is exposed through the exposure mask 6 and then developed to form the resist pattern 5B, since the step "S" generated by the lower level wiring conductor pattern 2 is positioned directly under the light blocking pattern 7 of the exposure mask 6, the exposure light 8 of the exposure machine is in no way irradiated onto the step "S", and therefore, a light reflected by the concave surface of the step "S" is never collected and focused onto a portion of the photoresist 5 corresponding to the upper level wiring conductor pattern. On the other hand, a newly generated right angle inside corner portion 2B does not give any adverse influence to the photoresist film 5, because a light 10A reflected and collected by a concave surface of the newly generated right angle inside corner portion 2B is not directed to the photoresist pattern 5B. Therefore, adverse influence of the halation caused by the step "S" is prevented, and therefore, a highly precise resist pattern 5B can be formed. In addition, when the upper level wiring conductor pattern 4A is formed, no floating pattern is formed, and therefore, the problem of the generation of the foreign matters can be eliminated.

Influence of the halation caused by the concave surface of the step varies upon the shape of the step, the angle of the surface of the step, and other factors. Therefore, in order to completely prevent the influence of the halation caused by the concave surface of the step, the dummy pattern 7A formed integrally with the inherent light block pattern 7 of the exposure mask 6 (and therefore, the dummy pattern 4B of the upper level wiring conductor pattern 4A) is preferred to partially overlap with the step "S" in the plan view. Alternatively, the dummy pattern 2A formed integrally with the lower level wiring conductor pattern 2 is preferred to partially overlap with the edge of the inherent light block pattern 7 of the exposure mask 6, and therefore, the edge of the upper level wiring conductor pattern 4A in the plan view. Here, considering a process margin, the degree of this partial overlapping is preferred to be not less than the process margin. On the other hand, considering a possible parasite capacitance formed by the dummy pattern 4B of the upper level wiring conductor pattern 4A or by the dummy pattern 2A of the lower level wiring conductor pattern 2, the degree of this partial overlapping should be preferably limited to several times the process margin, more preferably, to two or three times the process margin. In other words, if no problem of the parasite capacitance occurs, the degree of this partial overlapping is not limited.

On the other hand, if it is difficult or impossible either to cause the dummy pattern 7A of the exposure mask 6 (and therefore, the dummy pattern 4B of the upper level wiring conductor pattern 4A) to partially overlap with the step "S" in the plan view, or to cause the dummy pattern 2A of the lower level wiring conductor pattern 2 to partially overlap with the edge of the inherent light block pattern 7 of the exposure mask 6 (and therefore, the edge of the upper level wiring conductor pattern 4A) in the plan view, the dummy pattern 7A of the exposure mask 6 (and therefore, the dummy pattern 4B of the upper level wiring conductor pattern 4A) should be extended near to the step "S" in the plan view to a possible extent enough to substantially prevent the influence of the halation or to make the influence of the halation negligible, or alternatively, the dummy pattern 2A of the lower level wiring conductor pattern 2 should be extended near to the edge of the inherent light block pattern 7 of the exposure mask 6 (and therefore, the edge of the upper level wiring conductor pattern 4A) in the plan view to a possible extent enough to substantially prevent the influence of the halation or to make the influence of the halation negligible.

In the above mentioned two embodiments, the present invention is applied to a bent or angled portion of the lower level wiring conductor pattern where halation is easy to remarkably occur. However, it is to be noted that the present invention can be applied to an area where a lower level wiring conductor is provided in parallel to an upper level wiring conductor. Also, the present invention can be applied when the step is formed by a pattern other than the lower level wiring conductor pattern, or when the resist pattern formed from the photoresist formed to cover the step is used for forming a pattern other than the upper level wiring conductor pattern.

Furthermore, in the above mentioned two embodiments, the positive photoresist is used. However, the present invention can be applied when a negative photoresist is used. Moreover, the present invention can be applied not only to the process for manufacturing the semiconductor device, as mentioned above, but also to any other process which uses the photolithography.

As mentioned above, the semiconductor device in accordance with the present invention is characterized in that, the upper level pattern having a dummy pattern formed integrally therewith to extend near to the step formed on the surface of the semiconductor device in a plan view or to extend so as to partially overlap with the step formed on the surface of the semiconductor device in a plan view, or alternatively, the lower level pattern has a dummy pattern formed integrally therewith to extend near to an edge of the upper level pattern in a plan view, or to extend so as to overlap partially with the edge of the upper level pattern in the plan view. Therefore, when a photoresist film is exposed to form a resist pattern used for forming the upper level pattern, the irradiation light for the exposure is in no way irradiated onto the step, so that a highly precise resist pattern can be formed. In addition, since the dummy pattern never becomes a floating pattern, generation of foreign matters is prevented, and a highly reliable semiconductor device can be manufactured.

Furthermore, the process for manufacturing the semiconductor device in accordance with the present invention is characterized in that the exposure mask used for patterning a photoresist film used for forming an upper level pattern includes not only an inherent mask pattern corresponding to the upper level pattern but also a dummy pattern which covers the step generated by the lower level pattern and which is integral with the inherent mask pattern, or alternatively, the lower level pattern is previously provided with a dummy pattern which is integral with the lower level pattern and which extends near to an edge of the upper level pattern or to partially overlap with the edge of the upper level pattern. Therefore, the light reaching to the step to cause halation is blocked by the dummy pattern or the mask pattern itself of the exposure mask, so that no light is reflected by the surface of the step, and therefore, halation is prevented. Accordingly, a highly precise resist pattern and hence a highly precise upper level pattern can be formed. In addition, since the dummy pattern is integral with the upper level pattern or the lower level pattern, no floating pattern is generated, and generation of foreign matters is prevented. Thus, a highly reliable semiconductor device can be manufactured.

The invention has thus been shown and described with reference to the specific embodiments. However, it should be noted that the present invention is in no way limited to the details of the illustrated structures but changes and modifications may be made within the scope of the appended claims.

I claim:

1. A semiconductor device comprising a lower level wiring conductor pattern formed on a semiconductor substrate, said lower level wiring conductor pattern forming a stepped part on said semiconductor substrate, and an upper level wiring conductor pattern formed of a layer which is formed at a level higher than a level of a layer forming said lower level wiring conductor pattern, said upper level wiring conductor pattern having a dummy wiring conductor pattern formed integrally therewith to extend near to said stepped part in a plan view or to extend so as to partially overlap with said stepped part in the plan view.

2. A semiconductor device claimed in claim 1 further including an interlayer insulator film covering said lower level wiring conductor pattern, said stepped part being formed on a surface of said interlayer insulator film because of said lower level wiring conductor pattern, and said upper level wiring conductor pattern being formed on said interlayer insulator film.

3. A semiconductor device claimed in claim 1 wherein said lower level wiring conductor pattern is a field oxide film pattern formed on said semiconductor substrate.

4. A semiconductor device claimed in claim 2 wherein said lower level pattern is a lower level wiring conductor pattern, and said upper level pattern is an upper level wiring conductor pattern.

5. A semiconductor device comprising a lower level wiring conductor pattern formed on a semiconductor substrate, said lower level wiring conductor pattern forming a stepped part on said semiconductor substrate, and an upper level wiring conductor pattern formed of a layer which is formed at a level higher than a level of a layer forming said lower level wiring conductor pattern, said lower level wiring conductor pattern having a dummy wiring conductor pattern formed integrally therewith to extend near to an edge of said upper level wiring conductor pattern in a plan view, or to extend so as to overlap partially with said edge of said upper level wiring conductor pattern in the plan view.

6. A semiconductor device claimed in claim 5 further including an interlayer insulator film covering said lower level wiring conductor pattern, said stepped part being formed on a surface of said interlayer insulator film because of said lower level wiring conductor pattern, and said upper level wiring conductor pattern being formed on said interlayer insulator film.

7. A semiconductor device claimed in claim 6 wherein said lower level wiring conductor pattern is a is a field oxide film pattern formed in said semiconductor substrate.

* * * * *